United States Patent
Girard Desprolet et al.

(10) Patent No.: US 9,638,844 B2
(45) Date of Patent: May 2, 2017

(54) FORMING OF A NANOSTRUCTURED SPECTRAL FILTER

(71) Applicants: STMicroelectronics (Crolles 2) SAS, Crolles (FR); Commissariat a L'Energie Atomique et aux Energies Alternatives, Paris (FR)

(72) Inventors: Romain Girard Desprolet, Grenoble (FR); Sandrine Lhostis, Theys (FR); Salim Boutami, Grenoble (FR)

(73) Assignee: STMICROELECTRONICS (CROLLES 2) SAS, Crolles (FR)

( * ) Notice: Subject to any disclaimer, the term of this patent is extended or adjusted under 35 U.S.C. 154(b) by 403 days.

(21) Appl. No.: 14/305,378

(22) Filed: Jun. 16, 2014

(65) Prior Publication Data
US 2014/0374574 A1  Dec. 25, 2014

(30) Foreign Application Priority Data
Jun. 20, 2013 (FR) ..................... 13 55849

(51) Int. Cl.
*G02B 5/20* (2006.01)
*H01L 27/146* (2006.01)
(Continued)

(52) U.S. Cl.
CPC ............. *G02B 5/201* (2013.01); *G02B 5/008* (2013.01); *G02B 5/204* (2013.01);
(Continued)

(58) Field of Classification Search
CPC ........ G02B 5/201; G02B 5/204; G02B 5/008; G02B 2207/101; G02B 5/1809;
(Continued)

(56) References Cited

U.S. PATENT DOCUMENTS

| | | | | |
|---|---|---|---|---|
| 6,057,586 A | * | 5/2000 | Bawolek ........... | H01L 27/14621 257/434 |
| 7,166,797 B1 | * | 1/2007 | Dziendziel ............. | G02B 5/204 136/246 |

(Continued)

FOREIGN PATENT DOCUMENTS

| | | |
|---|---|---|
| GB | 2094018 A | 9/1982 |
| WO | WO-2008009931 A1 | 1/2008 |

OTHER PUBLICATIONS

EP Search Report for EP 14172908 dated Oct. 22, 2014 (2 pages).
(Continued)

*Primary Examiner* — John Lee
(74) *Attorney, Agent, or Firm* — Gardere Wynne Sewell LLP

(57) ABSTRACT

A spectral filter includes an assembly of filtering cells. Each cell has a same nanostructured pattern and a preferential direction of the pattern. This preferential direction is, for each cell, oriented approximately radially with respect to a single point of the spectral filter. Alternatively, this preferential direction is, for each cell, oriented approximately ortho-radially with respect to the single point of the spectral filter. The single point may be a center point. Alternatively, the single point may correspond to an optical axis of a lens element associated with the spectral filter.

16 Claims, 3 Drawing Sheets

(51) Int. Cl.
*G02B 5/00* (2006.01)
*B82Y 20/00* (2011.01)
*G02F 1/1335* (2006.01)

(52) U.S. Cl.
CPC .. *H01L 27/14621* (2013.01); *H01L 27/14625* (2013.01); *H01L 27/14627* (2013.01); *B82Y 20/00* (2013.01); *G02B 2207/101* (2013.01); *G02F 1/133509* (2013.01); *G02F 1/133514* (2013.01)

(58) Field of Classification Search
CPC ........ H01L 27/14621; H01L 27/14627; B82Y 20/00; G02F 1/133514; G02F 1/133509
See application file for complete search history.

(56) References Cited

U.S. PATENT DOCUMENTS

| | | | | |
|---|---|---|---|---|
| 7,999,454 | B2* | 8/2011 | Winters | H01L 27/3248 313/500 |
| 8,148,762 | B2* | 4/2012 | Joe | H01L 27/14621 257/292 |
| 8,569,855 | B2* | 10/2013 | Yokogawa | H01L 27/14625 257/432 |
| 8,847,345 | B2* | 9/2014 | Handa | B82Y 20/00 250/208.1 |
| 9,122,007 | B2* | 9/2015 | Mary | B82Y 20/00 |
| 9,159,761 | B2* | 10/2015 | Kokubun | H01L 27/14627 |
| 9,171,973 | B2* | 10/2015 | Girard Desprolet | G02B 5/203 |
| 9,258,536 | B2* | 2/2016 | Vaartstra | H04N 9/045 |
| 9,297,939 | B2* | 3/2016 | Palanchoke | G02B 5/208 |
| 2002/0018199 | A1* | 2/2002 | Blumenfeld | G06T 1/0007 356/73 |
| 2003/0210396 | A1 | 11/2003 | Hobbs et al. | |
| 2009/0020690 | A1 | 1/2009 | Toda | |
| 2009/0146198 | A1* | 6/2009 | Joe | H01L 27/14621 257/292 |
| 2011/0216229 | A1 | 9/2011 | Mary et al. | |
| 2011/0269364 | A1* | 11/2011 | Yoon | G02B 5/201 445/24 |
| 2011/0285898 | A1 | 11/2011 | Kasahara et al. | |
| 2012/0292521 | A1* | 11/2012 | Yokogawa | H01L 27/14625 250/372 |
| 2013/0153861 | A1* | 6/2013 | Kaminska | H01L 51/441 257/40 |
| 2013/0170018 | A1* | 7/2013 | Domash | G02B 26/007 359/320 |
| 2014/0168742 | A1* | 6/2014 | Hashimura | G02F 1/0018 359/245 |
| 2014/0374574 | A1* | 12/2014 | Girard Desprolet | G02B 5/201 250/208.1 |

OTHER PUBLICATIONS

INPI Search Report and Written Opinion for FR 1355849 mailed Jan. 29, 2014 (8 pages).
"Mode Filters for Multi-Moded Structures Having Radial Symmetry", Abstract of new technology from the Air Force Systems Command, Jan. 1, 1978 (3 pages).
Ebbesen, T.W. et al: "Extraordinary Optical Transmission Through Sub-Wavelength Hole Arrays," Nature(c) Macmillan Publishers Ltd 1998, pp. 667-669.

* cited by examiner

FORMING OF A NANOSTRUCTURED SPECTRAL FILTER

PRIORITY CLAIM

This application claims the priority benefit of French Patent Application number 1355849, filed on Jun. 20, 2013, the contents of which is hereby incorporated by reference in its entirety to the maximum extent allowable by law.

TECHNICAL FIELD

The present disclosure generally relates to image sensors and displays, and more specifically, to the forming of an array of spectral filters for such devices formed with microelectronic techniques.

BACKGROUND

Image sensors or displays, integrated in microelectronic devices, are generally formed of arrays of photodetectors associated with arrays of spectral filters. Among such filters, the forming of nanostructured spectral filters, defining patterns in a metal layer above a photodetector array, has already been provided.

Reference is made to PCT Publication WO-A-2010/029097 (U.S. Patent Application Publication 2011/0216229), the disclosure of which is incorporated by reference, which describes an example of nanostructured spectral filters.

SUMMARY

An embodiment aims at providing a spectral filter, formed of a plurality of filtering cells, where the responses of cells having a same nanostructured pattern are independent from the positions of the cells in the filter.

Another embodiment aims at a solution compatible with different patterns of nanostructured filters.

Another embodiment aims at a nanostructured spectral filter having a response independent from the angle of incidence of light.

Another embodiment aims at a nanostructured spectral filter which overcomes all or part of the disadvantages of usual filters.

An embodiment provides a spectral filter comprising at least one first set of filtering cells comprising a same nanostructured pattern, wherein a preferential direction of the pattern is, for each cell, oriented approximately radially or ortho-radially with respect to the center of the filter or to an optical axis.

According to an embodiment, said preferential direction is an axis of symmetry of the pattern.

According to an embodiment, said optical axis is that of a focusing device.

According to an embodiment, the device comprises several assemblies of filtering cells, each having a different pattern.

According to an embodiment, an image display device or image sensor device is also provided, comprising: an array of pixels or of sub-pixels of photodetectors or photoemitters; and a filter.

According to an embodiment, the device comprises a focusing device common to several pixels, said optical axis being confounded with that of said focusing device.

According to an embodiment, each filtering cell is associated with a pixel.

According to an embodiment, each pixel comprises several sub-pixels, each filtering cell being associated with a sub-pixel.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION OF THE DRAWINGS

Figure 1:
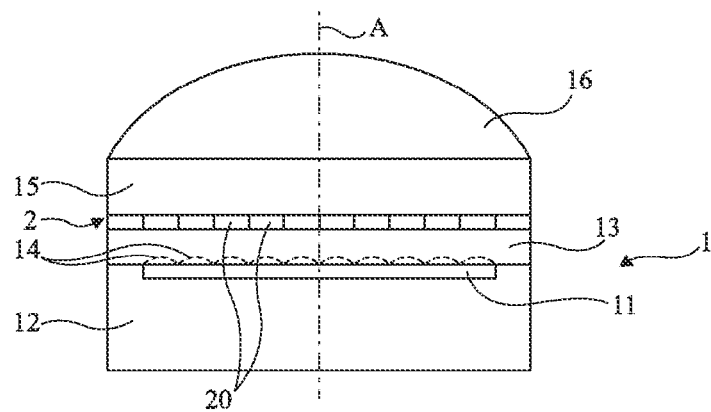
FIG. 1 is a very simplified cross-section view of an image sensor to which the embodiments which will be described apply as an example.

The same elements have been designated with the same reference numerals in the different drawings, which have been drawn out of scale. For clarity, only those steps and elements which are useful to the understanding of the embodiments which will be described have been shown and will be detailed. In particular, the operation of an image sensor or of a display is known per se and will not be detailed.

The embodiments will be described in relation with an example of spectral filters applied to an image sensor. These embodiments however also apply to a display.

Digital image sensors from the electronics industry equip more and more devices such as, for example, cell phones, digital photo cameras, computer cameras, etc. They are based on a photodetector array associated with a focusing optical system.

FIG. 1 is a very simplified cross-section view of an embodiment of a digital image sensor 1. Such a sensor is obtained by sawing from a batch of sensors formed on a wafer having at least a semiconductor region.

An array of photodetectors 11 (photoemitters in the case of a display) is formed on a substrate 12, based on a semiconductor material. Each photodetector defines a pixel or a sub-pixel of the sensor. Photodetector array 11 is generally covered with a dielectric layer 13 having an array 2 of filtering cells forming a spectral filter deposited thereon. Various circuits for processing the signals provided by the photodetectors may be integrated in device 1. For simplification, the various electronic circuits and their interconnections and connections to array 11 have not been illustrated. One or several protection layers 15 cover filter 2. Finally, a lens-type optical focusing device 16 is placed on the assembly.

Figure 2:
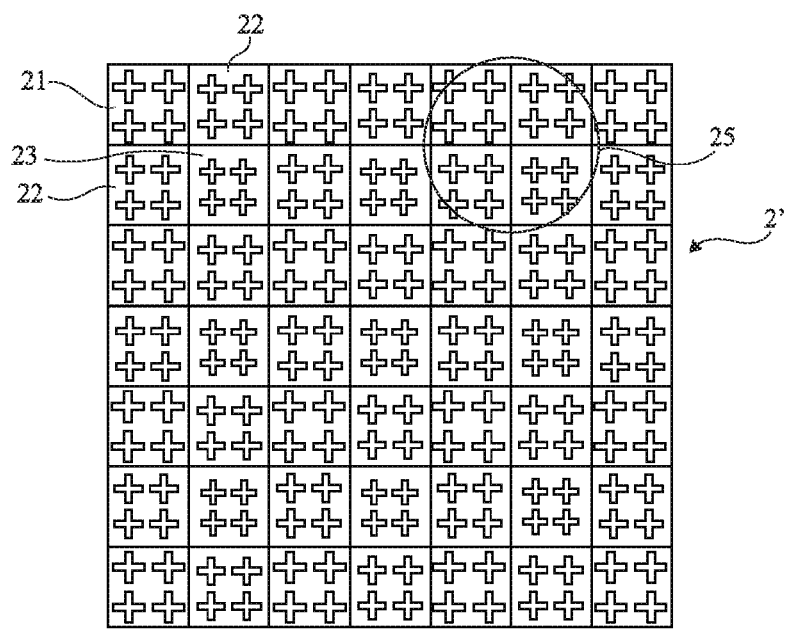
FIG. 2 is a top view of an example of spectral filter formed of an array of filtering cells with nanostructured patterns.

FIG. 2 is a simplified top view of an example of color filter 2', formed of a network or array of filtering cells 21, 22, and 23 arranged, in the shown example, according to a so-called "Bayer" diagram, particularly common to form RGB-type color filters (Red, Green, Blue).

Cells 21 to 23 are arranged in groups of four comprising a red filter 21, two green filters 22, and a blue filter 23 in the form of a square array, each cell being arranged on a sub-pixel of the photodetector (11, FIG. 1), to form a color pixel 25. In such an example, the image color is obtained from signals received by all the sub-pixels. The processing of the signals originating from the photodetectors is usual.

In the example of FIG. 2, the filtering cells have nano-structured patterns in the shape of networks of crosses at each of the pixels. The patterns of a same type of cells (21, 22, or 23) are identical. An example of such a network is described in above-mentioned document WO 2010/029097. Instead of a network of crosses, other shapes may be provided for the pattern of each filtering cell, for example, square, triangular, rectangular, round, oval or other shapes, according to the nature of the desired filtering (chromatic, infrared, etc.). Further, for a monochrome filter, or an infrared-type spectral filter, for example, each pixel (instead of each sub-pixel) is associated with a filtering cell.

Figure 3A:
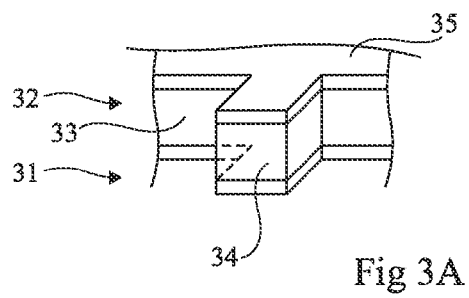
FIGS. 3A and 3B very schematically illustrate two embodiments of nanostructures of a filtering cell.
Figure 3B:
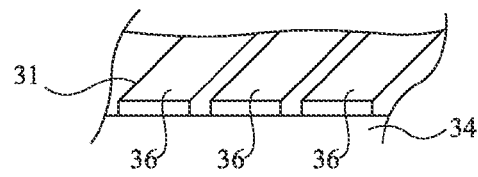

FIGS. 3A and 3B very schematically illustrate two embodiments of nanostructured filters.

FIG. 3A shows the case of a filter formed by stacking of two metal layers 31 and 32 with an interposed dielectric layer 33 (MIM, metal-insulator-metal). Layers 31 and 32 are shaped (in practice, deposited and then etched) according to the (geometrical) pattern desired for the filter, either by forming metal-insulator-metal pads or lines 34 and 35 (in the shown example, cross-shaped), or by opening the metal layer according to this pattern.

FIG. 3B illustrates another embodiment of such a filter which only uses a metal layer 31 on a dielectric level 34. In the example of FIG. 3B, the forming of parallel lines 36 to define the desired pattern has been assumed.

In devices forming image sensors based on pixel arrays, the lens-type optical device (16, FIG. 1) enables to focus the light on an array of pixels of photodetector 11. However, as a result, not all pixels 25 and sub-pixels 21 to 23 receive light under the same angle of incidence.

The characteristic dimensions of the nanostructures (in the arbitrary orientation of the drawing) of the filters in the respective cells could be adapted according to the distance from the center of the array (generally along the optical axis of lens 16) to take into account the incidence variation. However, such a solution does not take into account another parameter, that is, the azimuth of the light beam with which the pixel of sub-pixel sees the incoming light. Now, for nanostructured forms which are not obtained by revolution around the center of the sub-pixel or of the pixel, this parameter has an influence on the filter response, with an impact which is all the greater as the angle of incidence is large.

This results in variations of the spectral response of the different filters 21 to 23 according to their position on the image sensor. Now, the response of these filters should ideally be uniform across the entire pixel array to be able to properly restore the captured image.

In other words, as soon as the pattern of the filtering cell has a preferential direction (or a finite number of preferential directions), its spectral response varies according to its position relative to the optical axis (A, FIG. 1) of the focusing lens. This is true, in particular, for patterns having a finite number of axes of symmetry.

The optional presence of microlenses 14 (shown in dotted lines in FIG. 1) associated with each pixel or sub-pixel of array 11 slightly, but insufficiently, attenuates the effects due to the azimuth.

It is thus provided to modify the orientation of the pattern (for example, networks of openings or of pads) of the filtering cells according to the azimuth with which the cell sees the incoming light. More specifically, a preferential direction of the cell pattern is radially or ortho-radially aligned with respect to the center of the image sensor or to the optical axis of the focusing lens (of its intersection with the filter plane, which is generally confounded with the center of the sensor) or of any optical system. The preferential direction of the pattern corresponds to the direction for which the filtering cell has the best response. In practice, this direction is known for a given pattern.

This amounts to rotating the filtering cell pattern with respect to the center of the optical system projected on the filter (normal projection of the center of the lens onto the filter array) by an angle approximately equal to the azimuthal angle of the light beam reaching the filter in the considered region (the sub-pixel or pixel).

Figure 4:
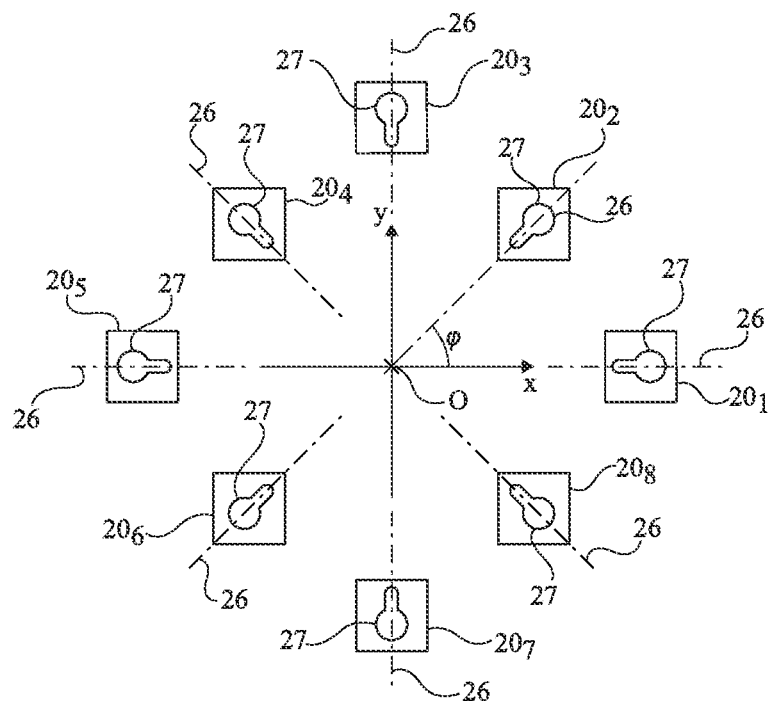
FIG. 4 illustrates the principle of an embodiment of a spectral filter.

FIG. 4 illustrates examples of orientations given to the patterns of filter cells 20 reproducing a same pattern 27, according to the azimuthal angle of each cell with respect to an axis X, running through intersection O of the optical axis of optical focusing device 16 with the filter plane. Two orthogonal axes X and Y of a reference frame of center O have arbitrarily been shown. Preferably, axes X and Y are in practice respectively parallel to the orthogonal directions of alignment of the filtering cells in the array filter, which correspond to the orthogonal directions of alignment of the photodetectors in array 11 (FIG. 1).

FIG. 4 shows, as an example, eight filtering cells $20_i$ (with i ranging from 1 to 8). Pattern 27, repeated in each cell $20_i$, is considered to have an axis of symmetry 26. In this example, this axis of symmetry is, for each cell, radial to center O. This amounts to orienting the pattern according to azimuthal angle φ with which the filtering cell sees the incoming light with respect to a reference axis, typically axis X. In other words, the angle formed by preferential direction 26 of the pattern with axis X corresponds to azimuthal angle φ of the light incident on the corresponding pixel.

It should be noted that rather than orienting the filtering cell or the openings or elementary pads of the pattern with respect to one another, one orients the pattern in the filtering cell. It would theoretically be possible to orient the filtering cell. However, this would make the forming of the array and of the photodetectors more difficult, since the latter would then all need to have the same direction.

Figure 5:
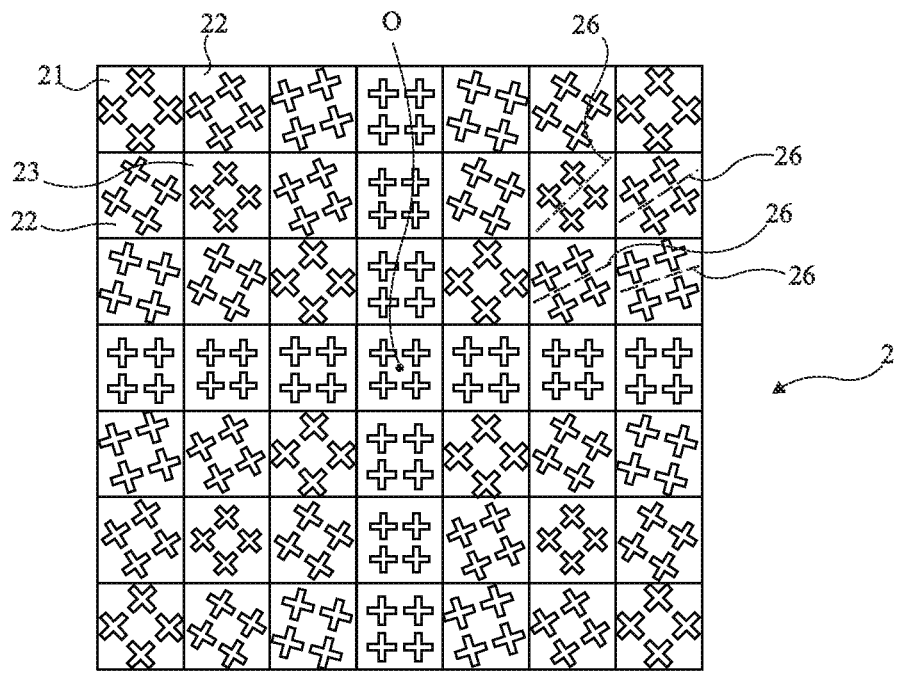
FIG. 5 is a simplified top view of an embodiment of a nanostructured color filter.

FIG. 5 illustrates the orientation of the different filtering cells 21, 22, and 23 of an RGB filter of the type illustrated in FIG. 2, according to their positions in array 2. In this example where each pattern comprises four crosses, it is considered that preferential direction 26 is the axis of symmetry separating the crosses in groups of two, the axis being radial to center 0.

Figure 6:
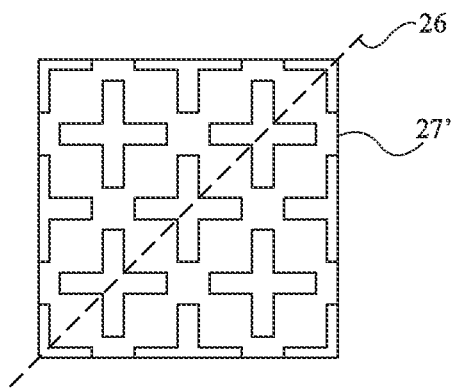
FIG. 6 is a simplified top view of an example of pattern of nanostructured filtering cell.

FIG. 6 shows another example of filtering cell having its nanostructured pattern 27' comprising several crosses. In this example, it is considered that the preferential direction does not correspond to one of the directions of the crosses but that it forms an angle of 45° with these directions. In other words, preferential direction 26 corresponds to the diagonal of pattern 27'.

FIGS. 7A, 7B, 7C, and 7D illustrate variations of filtering cell patterns and examples of possible preferential directions 26.

Figure 7A:
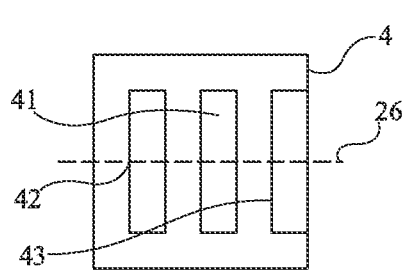
FIGS. 7A to 7D illustrate variations of filtering cell patterns.

FIG. 7A shows the case of a pattern 4 comprising recti-linear openings or pads 41, 42, 43 (rectangular).

Figure 7B:
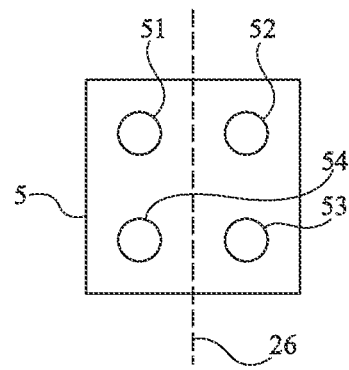

FIG. 7B illustrates the case of a pattern 5 comprising circular openings or pads 51, 52, 53, and 54, arranged in a square.

Figure 7C:
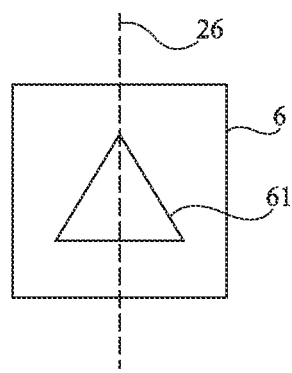

FIG. 7C illustrates the case of a pattern 6 comprising a triangle-shaped opening or pad 61.

Figure 7D:
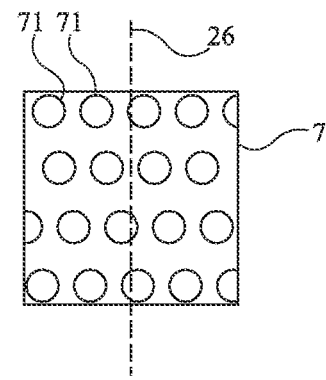

FIG. 7D illustrates the case of a pattern 7 having no axis of symmetry, but having preferential directions, comprising four horizontal lines of circular openings or pads 71, laterally offset from one line to the next one.

An advantage of the above-described embodiments is that the orientation given to the filtering cells associated with each sub-pixel (or pixel) makes the light intensity received by the photodetectors independent from their position in the photoreceiver array.

Another advantage is that the determination of the orientation to be given to the filtering cells is particularly easy. It is sufficient to determine a preferential direction of the pattern repeated in these cells.

It should be noted that the described solution is compatible with any nanostructured filter, whatever its structure (hole in a metal layer, metal pad, shape formed in an assembly of metal-insulator-metal type, etc.) and whatever the geometry and the elementary dimensions, which are usually selected according to the wavelengths to be filtered.

Various embodiments have been described, various alterations, modifications, and improvements will occur to those skilled in the art. In particular, where reference is made to an orientation, this should be understood to within manufacturing tolerances, and when reference is made of an approximate orientation, this means to within more or less 5 degrees. Further, the practical implementation of the described embodiments is within the abilities of those skilled in the art based on the functional indications given hereabove and on usual nanostructured filter manufacturing techniques and on the spectral response desired for the filter in a basic orientation.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An image device, comprising:
    an array of pixels or of sub-pixels of photo elements;
    a focusing device configured over said array, the focusing device having an optical axis; and
    a spectral filter for said array, comprising:
        at least one first assembly of filtering cells wherein the filtering cells of the first assembly have a common nanostructured pattern having an axis of symmetry defining a preferential direction, the common nanostructured pattern being symmetrical to the axis of symmetry,
    wherein each filtering cell is associated with a corresponding pixel or sub-pixel of said array,
    wherein the preferential direction of each common nanostructured pattern at each cell is oriented approximately radially or ortho-radially with respect to the optical axis of said focusing device.

2. The device of claim 1, comprising several assemblies of filtering cells, each having a different nanostructured pattern.

3. The device of claim 2, wherein the spectral filter is an RGB-type color filter comprising a group of filtering cells, and wherein the different nanostructured patterns comprise networks of crosses of different sizes.

4. The device of claim 3, wherein each nanostructured pattern comprises a plurality of crosses, wherein the preferential direction is an axis of symmetry separating the crosses into two groups, and wherein the cells are radial to a center of the device.

5. The device of claim 1, wherein the nanostructured pattern comprises a plurality of crosses and wherein the preferential direction forms an angle of 45° with respect to the crosses.

6. The device of claim 1, wherein the nanostructured pattern comprises a plurality of rectangular structures.

7. The device of claim 1, wherein the nanostructured pattern comprises a triangular structure.

8. The device of claim 1, wherein the nanostructured pattern comprises a plurality of circular structures.

9. The device of claim 8, wherein the circular structures are arranged in columns and rows.

10. The device of claim 9, wherein the circular structures in adjacent rows or columns are laterally offset from each other.

11. The device of claim 1, wherein each filtering cell is associated with a pixel.

12. The device of claim 1, wherein each pixel comprises several sub-pixels, each filtering cell being associated with a sub-pixel.

13. The device of claim 1, wherein said photo elements are emitters.

14. The device of claim 1, wherein said photoelements are receivers.

15. A spectral filter, comprising:
    a plurality of filtering cells assembled in an array associated with an optical axis;
    wherein each filtering cell includes a nanostructured pattern;
    wherein said nanostructured pattern in each filtering cell is symmetrical about a preferential direction;
    wherein said nanostructured pattern is the same for each of the filtering cells; and
    wherein the preferential direction of each filtering cell is oriented to point in the direction towards the optical axis.

16. A spectral filter, comprising:
    a plurality of filtering cells assembled in an array associated with an optical axis;
    wherein each filtering cell includes a nanostructured pattern;
    wherein said nanostructured pattern in each filtering cell is symmetrical about a preferential direction;
    wherein said nanostructured pattern is the same for each of the filtering cells; and
    wherein the preferential direction of each filtering cell is oriented perpendicular to a radial line extending outwardly from said optical axis.

* * * * *